(12) United States Patent
Miura et al.

(10) Patent No.: US 7,094,625 B2
(45) Date of Patent: Aug. 22, 2006

(54) FIELD EFFECT TRANSISTOR AND METHOD OF PRODUCING THE SAME

(75) Inventors: Daisuke Miura, Numazu (JP); Tomonari Nakayama, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/535,202

(22) PCT Filed: Mar. 26, 2004

(86) PCT No.: PCT/JP2004/004346

§ 371 (c)(1),
(2), (4) Date: May 17, 2005

(87) PCT Pub. No.: WO2004/087836

PCT Pub. Date: Oct. 14, 2004

(65) Prior Publication Data

US 2006/0099732 A1    May 11, 2006

(30) Foreign Application Priority Data

Mar. 31, 2003    (JP)    ............................. 2003-096210

(51) Int. Cl.
*H01L 51/40*    (2006.01)
*H01L 21/00*    (2006.01)
*H01L 51/00*    (2006.01)

(52) U.S. Cl. ...................... 438/99; 438/82; 257/E21.4; 257/40; 257/642

(58) Field of Classification Search .................. 438/99, 438/82; 257/40, 642
See application file for complete search history.

(56) References Cited

U.S. PATENT DOCUMENTS

2003/0226996 A1 * 12/2003 Aramaki et al. ....... 252/62.3 Q

FOREIGN PATENT DOCUMENTS

EP    0 917 216    5/1999
EP    0 921 579    6/1999

OTHER PUBLICATIONS

Satoshi Ito, et al., "A new synthesis of [2,3]naphthoporphyrins", Chem. Commun., XP-002288611, (2000) pp. 893-894.

* cited by examiner

*Primary Examiner*—Richard Elms
*Assistant Examiner*—Mohsen Ahmadi
(74) *Attorney, Agent, or Firm*—Fitzpatrick, Cella, Harper & Scinto

(57) ABSTRACT

A field effect transistor having a high field effect mobility is provided which can be obtained by a simple method. The field effect transistor includes an organic semiconductor layer composed of a crystallized film of a naphthoporphyrin compound represented by formula (2), which is obtained by the conversion by heating of the coating film of a porphyrin compound represented by formula (1), the organic semiconductor layer having crystal grains with a maximum diameter of 1 μm or more, wherein $R_1$ and $R_2$ each independently denote at least one selected from the group consisting of hydrogen, halogen, hydroxyl, and alkyl having 1 to 12 carbon atoms; $R_3$ denotes at least one selected from the group consisting of a hydrogen atom and an aryl group; and M denotes two hydrogen atoms, a metal atom or a metal oxide.

10 Claims, 1 Drawing Sheet

FIELD EFFECT TRANSISTOR AND METHOD OF PRODUCING THE SAME

TECHNICAL FIELD

The present invention relates to a field effect transistor and a method of producing the same, particularly to a field effect transistor which can be easily produced and has a high mobility and a method of producing the same, by using, as an active layer, a crystallized film of a naphthoporphyrin compound which is obtained by heating a coating film of a porphyrin compound soluble in organic solvents.

BACKGROUND ART

Non-linear optical properties, electrical conductivity and semiconductivity of organic semiconductor compounds have received attention in organic electronics and optoelectronics fields, and the development of various devices has been advanced actively. Typical examples of the organic semiconductor compounds include phthalocyanine compounds, porphyrin compounds and polyacenes. Properties such as non-linear optical properties, electrical conductivity and semiconductivity, which are required for using these compounds as organic materials to form devices, largely depend on crystallinity and orientation other than only purity of the materials. However, it has been difficult to highly purify these materials due to the reason that many compounds with extended π-conjugated systems are insoluble in solvents and susceptible to oxidation in air. In addition, a large-scale apparatus has been required for forming films, for example, a vacuum deposition apparatus for performing formation of a crystallized film with high orientation.

In recent years, organic field effect transistor (FET) devices using organic semiconductor compounds as the semiconductor layers have received attention. Organic semiconductor compounds, which show more flexible film properties compared with the properties of inorganic materials such as silicon, have been regarded as suitable materials for fabricating flexible devices using plastics as substrates.

However, as described above, pentacene and the like that are typical examples of organic semiconductor compounds are hardly soluble in solvents due to high crystallinity, so the formation of their films on substrates has only been possible by vacuum deposition. On the other hand, FETs are more easily fabricated by forming thin films by spin coating or the like from a solution of an organic semiconductor soluble in organic solvents. As an example of the above, π-conjugated polymers are used for semiconductor layers (Refer to "Japanese Journal of Applied Physics", Japan Society of Applied Physics, Vol. 30, p. 596–598, 1991). In the case of π-conjugated polymers, it is known that the state of the orientation of molecular chains largely affects the electrical conductive properties. Similarly, it is reported that the field effect mobility of π-conjugated polymer field effect transistors largely depends on the state of the orientation of molecular chains in semiconductor layers (Refer to "Nature", Nature Publishing Group, Vol. 401, P. 685–687, 1999).

However, since the molecular chains of π-conjugated polymers are oriented in a period between the coating of a solution and the drying of the same, there has been a possibility in which the state of the orientation of molecular chains largely varies depending on the change of environment or the difference of coating methods. There is also reported a FET using a film in which a soluble precursor thin film of pentacene is formed by coating and transformed to pentacene by heat-treatment ("Advanced Materials", WILEY-VCH Verlag GmbH, Vol. 11, p. 480–483, 1999). In this case, the conversion to pentacene has required a high-temperature treatment, and eliminated components with a large mass must have been removed under a reduced pressure.

DISCLOSURE OF THE INVENTION

As described above, FET devices using organic semiconductors have required a complicated process such as vacuum film forming, or have had problems that they are susceptible to environment.

The present invention has been created to solve these problems, and it is an object of the present invention to provide a field effect transistor with a high field-effect mobility, which includes an organic semiconductor layer formed by a simple method, and to provide a method of producing the same.

The present inventors have found that a crystallized film can be easily obtained by heat-treating a coating film obtained when an organic solvent solution of a porphyrin compound represented by general formula (1) is coated on the surface of a substrate, and that the field effect transistor using this crystallized film as an organic semiconductor layer exhibits the field effect mobility that is the same as or higher than that of the organic semiconductor layer whose film formed by conventional vapor deposition. The present invention has been created based on these findings.

Namely, a method of producing a field effect transistor including an organic semiconductor layer according to the present invention is characterized by comprising a step of heating a coating film comprising a porphyrin compound represented by general formula (1):

general formula (1)

wherein $R_1$ and $R_2$ each independently denote at least one selected from the group consisting of hydrogen, halogen, hydroxyl, and alkyl, oxyalkyl, thioalkyl and alkyl ester, each alkyl having 1 to 12 carbon atoms; $R_3$ denotes at least one selected from the group consisting of a hydrogen atom and an aryl group; and M denotes two hydrogen atoms, a metal atom or a metal oxide;

to form, as the organic semiconductor layer, a crystallized film of a naphthoporphyrin compound represented by general formula (2):

general formula (2)

wherein $R_2$, $R_3$ and M each denote the same as defined above.

Further, the above described coating film of a porphyrin compound represented by general formula (1) is heated in a range from 200 to 350° C. to form the compound represented by general formula (2).

Further, the field effect transistor according to the present invention is characterized by including an organic semiconductor layer composed of a crystallized film of a naphthoporphyrin compound which is obtained by heating the coating film comprising a porphyrin compound represented by general formula (1):

general formula (1)

wherein $R_1$ and $R_2$ each independently denote at least one selected from the group consisting of hydrogen, halogen, hydroxyl, and alkyl, oxyalkyl, thioalkyl and alkyl ester, each alkyl those having 1 to 12 carbon atoms; $R_3$ denotes at least one selected from the group consisting of a hydrogen atom and an aryl group; and M denotes two hydrogen atoms, a metal atom or a metal oxide, to convert the porphyrin compound to a naphthoporphyrin compound represented by general formula (2):

general formula (2)

wherein $R_2$, $R_3$ and M each denote the same as define above, to form the organic semiconductor layer composed of a crystallized film of the naphthoporphyrin, the organic semiconductor layer having crystal grains with a maximum diameter of 1 μm or more and having a strong absorption at 650 nm or longer.

Each of $R_1$ and $R_2$ of the above porphyrin compound represented by general formula (1) is preferably a hydrogen atom, and $R_2$ of the naphthoporphyrin compound represented by general formula (2) is preferably a hydrogen atom.

$R_3$ of the above porphyrin compound represented by general formula (1) and of the above naphthoporphyrin compound represented by general formula (2) is preferably a hydrogen atom.

M of the above porphyrin compound represented by general formula (1) and of the above naphthoporphyrin compound represented by general formula (2) is preferably two hydrogens.

M of the above porphyrin compound represented by general formula (1) and of the above naphthoporphyrin compound represented by general formula (2) is preferably one copper atom.

The above organic semiconductor layer preferably has a field effect mobility of $1 \times 10^{-3}$ cm$^2$/V·s or more and an On/Off ratio of 100 or more.

The present invention can provide a field effect transistor with a high field effect mobility by a simple method that is extremely simple compared to conventional methods.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

BEST MODE FOR CARRYING OUT THE INVENTION

Preferred embodiments of the present invention will now be described in detail in accordance with the accompanying drawings.

Hereinafter, the present invention will be described in detail.

The field effect transistor according to the present invention includes an organic semiconductor layer composed of a crystallized film of a naphthoporphyrin compound which is obtained by heating the coating film comprising a porphyrin compound represented by general formula (1):

general formula (1)

wherein $R_1$ and $R_2$ each independently denote at least one selected from the group consisting of hydrogen, halogen, hydroxyl, and alkyl, oxyalkyl, thioalkyl and alkyl ester, each alkyl having 1 to 12 carbon atoms; $R_3$ denotes at least one selected from the group consisting of a hydrogen atom and an aryl group; and M denotes two hydrogen atoms, a metal atom or a metal oxide, to convert the porphyrin compound to form the organic semiconductor layer composed of a crystallized film of a naphthoporphyrin compound represented by general formula (2):

general formula (2)

wherein $R_2$, $R_3$ and M each denote the same as defined above.

In the present invention, the substituent $R_1$ bonded to a dicyclooctaene ring of the above porphyrin compound represented by general formula (1) is eliminated in the form of $R_1$—CH=CH—$R_1$ when the porphyrin compound is converted to a naphthoporphyrin compound represented by general formula (2) by heating. Therefore, $R_1$ may be each independently at least one selected from the group consisting of hydrogen, halogen, hydroxyl, alkyl, oxyalkyl, thioalkyl and alkyl ester, each alkyl having 1 to 12 carbon atoms, or may be a combination of two or more thereof. If the number of carbon atoms exceeds 12, the molecular weight of an eliminated component increases and the eliminated component remains in a naphthoporphyrin compound film, resulting in inadequate semiconductor properties. $R_1$ is most preferably a hydrogen atom.

The substituent $R_2$ of the porphyrin compound represented by general formula (1) remains as a substituent in the naphthoporphyrin compound obtained after heat treatment. Therefore, the substituent $R_2$ affects the orientation of naphthoporphyrin. $R_2$ may be each independently at least one selected from the group consisting of hydrogen, halogen, hydroxyl and alkyl, oxyalkyl, thioalkyl and alkyl ester, each alkyl having 1 to 12 carbon atoms, or may be a combination of two or more thereof. If the number of carbon atoms of $R_2$ exceeds 12, the existence ratio of a porphyrin ring to the whole molecule is reduced to prevent the orientation of porphyrin rings, resulting in inadequate semiconductor properties. Most preferably, $R_2$ is a hydrogen atom, wherein the stacking of porphyrin rings more easily occurs, which enhances the crystallinity of a film.

M of a porphyrin compound is not particularly limited, provided that M is two hydrogens, metal or a metal oxide. The example of metal includes copper, gold, silver, zinc, nickel, chromium, magnesium, lithium or cobalt. The example of the metal oxide includes the oxide of iron, titanium or aluminum. Most preferably, M is two hydrogen atoms or one copper atom.

A method of forming the organic semiconductor layer is preferably includes a method in which a porphyrin compound represented by general formula (1) is dissolved in a solvent, coated on a substrate and then heated to obtain a crystallized film of a naphthoporphyrin compound represented by general formula (2).

The solvent to be used for dissolving the porphyrin compound is not particularly limited, provided that it does not react with the porphyrin compound nor precipitate the same. Further, two or more solvents may be mixed for use. Halogenated organic solvents are preferably used in consideration of smoothness of the surface of a coating film and the uniformity of a film thickness. The example of the halogenated organic solvent includes chloroform, methylene chloride, dichloroethane, chlorobenzene or 1,2-dichloroethylene. The solution is arbitrarily adjusted to any concentration depending on desired film thicknesses, preferably from 0.01 to 5% by weight.

A coating method includes a spin casting method, a dipping method, a dropping method, a printing method such as an offset or a screen printing or an ink jet method. Further, it is desirable to preliminarily filter the solution through a membrane filter in order to prevent the intrusion of dirt and the like into a semiconductor layer as much as possible. Because insolubles and the intrusion of dirt from outside prevent uniform orientation and cause the increase of the off current and the reduction of the On/Off ratio. The coating film of naphthoporphyrin may also be preliminarily dried at 130° C. or lower.

The coated film of a porphyrin compound is subjected to a retro Diels-Alder reaction by heating to be converted to a naphthoporphyrin compound, which involves the elimination of —R—CH=CH—$R_1$. At the same time as the production of the naphthoporphyrin compound, the crystal growth is caused by the stacking of porphyrin rings, resulting in a crystallized film of the naphthoporphyrin compound. The elimination reaction occurs at 200° C. or higher. However, the desired heating-temperature for obtaining a higher field effect mobility is from 200 to 350° C., preferably from 250 to 300° C. A crystallized film with an adequate crystal growth cannot be obtained at a temperature of lower than 200° C., and cracks will occur due to an abrupt shrinkage of the film when the temperature exceeds 350° C.

The heating is carried out on a hot plate, in a hot air-circulating oven or in a vacuum oven. An instantaneous heating method on a hot plate is preferred for obtaining uniform orientation. Further, in order to obtain higher crystallinity, the coating film before heat treatment is preferably subjected to rubbing treatment in which it is lightly rubbed with a cloth or the like. The cloth for use in the rubbing treatment includes, but not limited to, rayon, cotton or silk.

The desired film thickness of the organic semiconductor layer using the oriented film of the naphthoporphyrin compound obtained by these operations is in the range from 30 to 150 nm, preferably from 50 to 100 nm. When the film thickness is less than 30 nm, the uniformity of the film thickness will be impaired. On the other hand, when it is exceeds 150 nm, the mobility will be reduced due to the impairment of the smoothness of a film surface.

The crystal growth can be verified by X-ray diffraction, film surface observation using an optical microscope, a laser microscope or the like and an ultraviolet-visible light absorption spectrum of the film. The desired maximum diameter of the crystal grains in the organic semiconductor layer is in the range of 1 μm or more, preferably 2 μm or more. If it is less than 1 μm, adequate field effect mobility cannot be obtained.

Further, it is preferable that a strong absorption is observed at 650 nm or longer in the ultraviolet-visible light spectrum of the organic semiconductor layer. If no absorption or only a weak absorption is observed at 650 nm or more, the stacking of porphyrin rings will be weak and will not be oriented adequately, resulting in the reduction of field effect mobility.

The organic semiconductor layer obtained in the present invention has a field effect mobility of $1 \times 10^{-3}$ cm²/V·S or more. If the field effect mobility is lower than the above value, the current value between a source and a drain obtained by applying a gate voltage will be too low to be suitable for driving a liquid crystal device or the like. In addition, the above organic semiconductor layer has an On/Off ratio of 100 or more.

Figure 1:
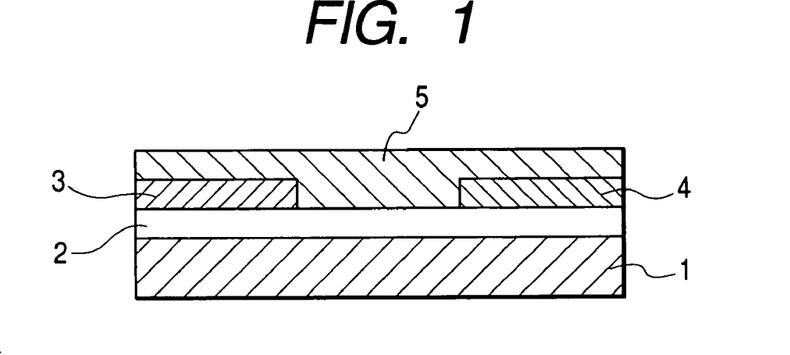
FIG. 1 is an enlarged schematic view showing a part of the field effect transistor of the present invention.

FIG. 1 is an enlarged schematic view showing a part of the field effect transistor of the present invention. The field effect transistor of the present invention is composed of a gate electrode 1, a gate insulating layer 2, a source electrode 3, a drain electrode 4 and an organic semiconductor layer 5.

Materials for the gate electrode, source electrode and drain electrode are not particularly limited, provided that they are electrically conductive materials, and include platinum, gold, silver, nickel, chromium, copper, iron, tin, antimony, lead, tantalum, indium, aluminum, zinc, magnesium and alloys thereof; conductive metal oxides such as indium-tin oxide; and inorganic and organic semiconductors whose conductivity is increased by doping or the like, for example, a silicon single crystal, a polysilicon, an amorphous silicon, germanium, graphite, polyacetylene, polyparaphenylene, polythiophene, polypyrrole, polyaniline, polythienylenevinylene and polyparaphenylenevinylene. A method of forming electrodes includes a sputtering method, a vapor deposition method, a printing method from a solution or a paste or an ink jet method. Further, preferable electrode materials among the above list are those having a low electrical resistance at the contact surface with a semiconductor layer.

Any gate insulating layer may be used, provided that a solution of the porphyrin compound represented by general formula (1) can be uniformly coated thereon, but those having a high dielectric constant and low conductivity are preferred. Examples include inorganic oxides and nitrides such as silicon oxide, silicon nitride, aluminum oxide, titanium oxide and tantalum oxide; and organic polymers such as polyacrylates, polymethacrylates, polyethylene terephthalate, polyimides and polyethers. In addition, among the above insulating materials, those having a high surface-smoothness are preferred.

In order to improve the uniformity on the insulating layer of the coating film of a solution of the porphyrin compound soluble in organic solvents represented by general formula (1), and to make the orientation of the film of the naphthoporphyrin compound represented by general formula (2) uniform by heating, it is also possible to modify only the surface of the insulating film. The method includes a dry treatment using ozone, plasma and a hexamethyldisilane gas and a wet treatment using a solution prepared by dissolving tetraalkoxysilane, trichlorosilane, a surfactant and the like in an organic solvent.

The structure of the field effect transistor according to the present invention is not limited to a thin film type but may be a cubic type.

EXAMPLES

Hereinafter, synthesis examples and examples will be shown. However, the present invention is not limited to these examples.

Synthesis Example 1

Synthesis of Bicycloporphyrin

Step (1)

A THF solution of 1 g (7.3 mmol) of anthranilic acid was dropped into a mixed solution under reflux of 0.77 ml (8.0 mmol) of 1,3-cyclohexadiene, 1.1 ml of isoamyl nitrite and 50 ml of tetrahydrofuran. Then, the resultant solution was heated and refluxed for 2 hours to remove THF, extracted with chloroform, washed with distilled water and saturated saline, dried with anhydrous sodium sulfate and purified with silica gel column-chromatography-(chloroform) to obtain 1,4-dihydro-1,4-ethanonaphthalene (0.89 g, 5.7 mmol, yield: 78%).

Step (2)

Under an argon atmosphere, a mixed solution of 0.156 g (1 mmol) of the obtained 1,4-dihydro-1,4-ethanonaphthalene, 30 ml of chloroform and 0.12 ml (1.0 mmol) of sulfenyl chloride was cooled to −78° C. and stirred for one hour. Then, after the solvent was removed, the product was purified with silica gel column chromatography (chloroform) to obtain 2-chloro-1,2,3,4-tetrahydro-3-phenylthio-1,4-ethanonaphthalene (0.286 g, 0.96 mmol, yield: 96%).

Step (3)

A solution of 0.286 g (0.96 mmol) of the obtained 2-chloro-1,2,3,4-tetrahydro-3-phenylthio-1,4-ethanonaphthalene and 30 ml of chloroform was cooled to 0° C., added with 0.51 g of 75% m-chloroperbenzoic acid and stirred for two hours at room temperature. Then, the reaction solution was added with an aqueous saturated sodium bicarbonate solution and extracted with chloroform. The extract was washed with distilled water and saturated saline, dried with anhydrous sodium sulfate and purified with silica gel column chromatography (chloroform) to obtain 2-chloro-1,2,3,4-tetrahydro-3-phenylsulfony-1,4-ethanonaphthalene (0.3 g, 0.91 mmol, yield: 95%).

Step (4)

A solution of 0.3 g (0.91 mmol) of the obtained 2-chloro-1,2,3,4-tetrahydro-3-phenylsulfonyl-1,4-ethanonaphthalene and 15 ml of anhydrous THF was cooled to 0° C., added with 2.5 ml of 1,8-diazabicyclo[5.4.0]-7-undecene and stirred for 30 minutes. The solution is then added with a dilute hydrochloric acid solution, extracted with chloroform, washed with distilled water, an aqueous saturated sodium bicarbonate solution and saturated saline and dried with anhydrous sodium sulfate. The product was purified with silica gel column chromatography (chloroform) to obtain 1,4-dihydro-2-phenylsulfony-1,4-ethanonaphthalene (0.264 g, 0.89 mmol, yield: 98%).

Step (5)

Under an argon atmosphere, 0.296 g (1.0 mmol) of the obtained 1,4-dihydro-2-phenylsulfonyl-1,4-ethanonaphthalene, 0.13 ml (1.15 mmol) of ethyl isocyano-acetate and 30 ml of anhydrous THF were charged and cooled to 0° C. Into the mixture, 1.7 ml of tert-BuOK (1 M THF solution) was dropped over two hours and the resultant mixture was stirred for three hours at room temperature. After the completion of reaction, the reaction mixture was added with dilute hydrochloric acid, washed in turn with an aqueous saturated sodium bicarbonate solution, distilled water and saturated saline and dried with anhydrous sodium sulfate. The product was purified with silica gel column chromatography (chloroform) to obtain ethyl-4,9-dihydro-4,9-ethano-2H-benz[f]isoindole-1-carboxylate (0.243 g, yield: 91%).

Step (6)

Under an argon atmosphere, a mixed solution of 0.243 g (0.91 mmol) of the obtained ethyl-4,9-dihydro-4,9-ethano-2H-benz[f]isoindole-1-carboxylate and 15 ml of anhydrous THF was cooled to 0° C., added with 0.10 g (2.7 mmol) of a lithium aluminum hydride powder and stirred for two hours. Then, the reaction solution from which THF was removed was extracted with chloroform, washed in turn with an aqueous saturated sodium bicarbonate solution, distilled water and saturated saline and dried with anhydrous sodium sulfate. The reaction solution was filtered, purged with argon, light-shielded, added with 10 mg of p-toluene sulfonic acid and stirred for 16 hours at room temperature. Further, the reaction solution was added with 0.11 g of p-chloranil and stirred for 16 hours at room temperature. The solution was washed in turn with an aqueous saturated sodium bicarbonate solution, distilled water and saturated saline and dried with anhydrous sodium sulfate. The solution was concentrated and then subjected to alumina column chromatography (chloroform) and recrystallization (chloroform/methanol) to obtain bicycloporphyrin represented by general formula (3) (0.037 g, 0.045 mmol, yield: 20%).

Synthesis Example 2

(3)

Synthesis of a bicycloporphyrin-copper complex

A solution of 0.1 g (0.12 mmol) of the above bicycloporphyrin and 0.065 g (0.36 mmol) of copper acetate dihydrate in 30 ml of chloroform plus 3 ml of methanol was stirred for three hours at room temperature. The reaction solution was washed with distilled water and saturated saline and then dried with anhydrous sodium sulfate. The solution was concentrated and then recrystallized from chloroform/ methanol to obtain a bicycloporphyrin-copper complex represented by general formula (4) (0.11 g, 0.12 mmol, yield: 100%).

Example 1

(4)

FIG. 1 shows the structure of the field effect transistor according to the present invention.

First, an N-type silicon substrate was provided as the gate electrode 1. A silicon oxide film with a thickness of 5,000 angstroms obtained by thermally oxidizing the surface layer of the silicon substrate was used as the gate insulating layer 2. Chromium and gold were vapor-deposited in turn thereon, and the source electrode 3 and drain electrode 4 were formed by a conventional photolithography technique. Subsequently, the substrate was surface-treated by ozone treatment and then a 1% by weight solution of bicycloporphyrin synthesized in Synthesis Example 1 (formula (3)) in chloroform was spin-cast on the substrate. Further, the substrate was heated at 290° C. to form the organic semiconductor layer 5 composed of the compound of formula (5) shown below. The organic layer had a film thickness of 60 nm, and the observation with an optical microscope revealed that the maximum diameter of crystal grains was 2.5 µm.

Figure 2:
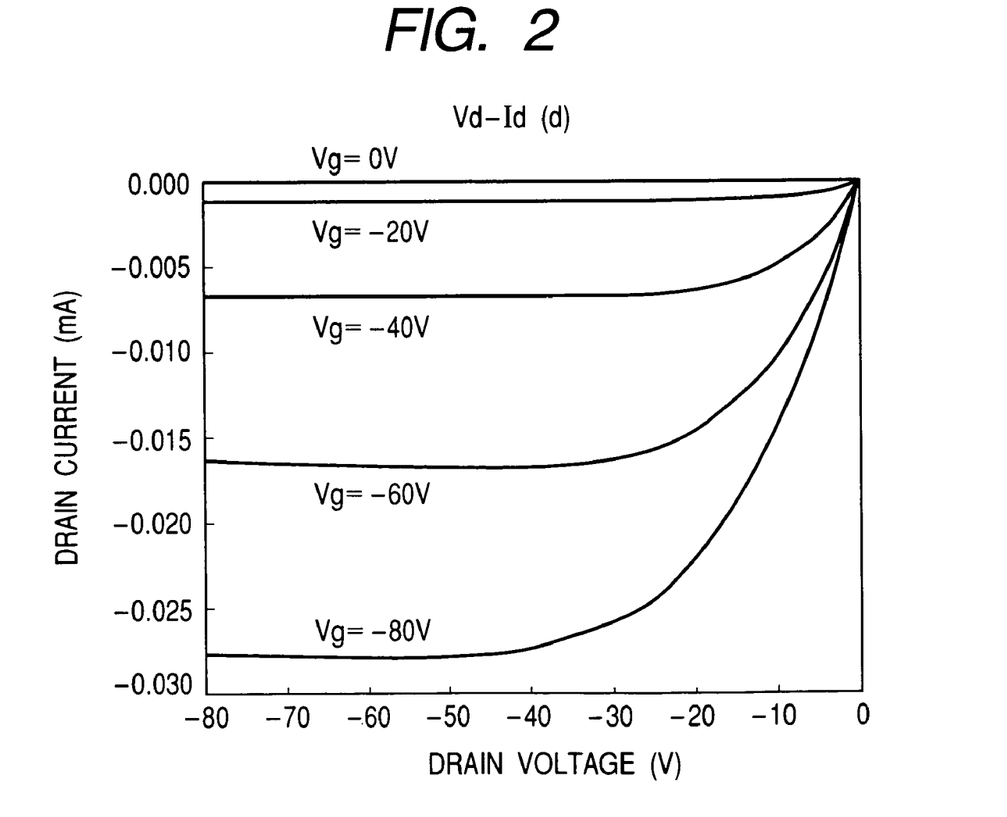
FIG. 2 is a graph showing electrical properties of the field effect transistor in Example 1 of the present invention.

The field effect transistor with a channel length of 50 µm and a channel width of 10 mm was prepared according to the above procedure. The $V_d$-$I_d$ and $V_g$-$I_d$ curves of the prepared transistor were measured using Parameter Analyzer 4156C (trade name) made by Agilent Company (FIG. 2). Mobility µ (cm$^2$/Vs) was calculated according to formula (1) below:

$$I_d = \mu(CiW/2L)(V_g-V_{th})^2 \quad \text{(formula 1)}$$

wherein Ci denotes capacitance (F/cm$^2$) per unit area of the gate insulating film; W and L denote a channel width (mm) and a channel length (µm) respectively shown in the example; and $I_d$, $V_g$ and $V_{th}$ denote a drain current (A), a gate-voltage (V) and a threshold voltage (V) respectively. Further, the ratio of Id for $V_g$=−80 V and Id for 0V at $V_d$=80 V was defined as an ON/OFF ratio. The obtained results showed that the transistor had a field-effect mobility of 1.4×10$^{-3}$ cm$^2$/V·s and an On/Off ratio of 600.

The organic semiconductor layer 5 composed of a naphthoporphyrin compound was formed on a quartz substrate according to a similar film-forming condition. The observation of the ultraviolet-visible light absorption spectrum of the film using a spectrophotometer U3310 (trade name) made by Hitachi, Ltd. showed the absorption around 700 nm.

Example 2

(5)

A field effect transistor was prepared in which an organic semiconductor layer composed of the compound of the formula (6) shown below was formed similarly as in Example 1 except that bicycloporphyrin described in Example 1 was replaced by a bicycloporphyrin-copper complex (formula (4)) synthesized in Synthesis Example 2. The field effect transistor had a field-effect mobility of 1.3×10$^{-3}$ cm$^2$/V·s and an On/Off ratio of 500. The organic semiconductor layer had a film thickness of 60 nm, and the maximum diameter of crystal grains was 2.0 µM.

The organic semiconductor film composed of the compound of the formula (6) prepared on a quartz plate showed the absorption around 700 nm.

Comparative Example 1

(6)

A field effect transistor was prepared similarly as in Example 1 except that a vapor-deposited film of metal-free phthalocyanine commercially available (made by Sigma Aldrich Japan K.K.) was used for the organic semiconductor layer in place of bicycloporphyrin described in Example 1. The vapor-deposited film was prepared at a substrate temperature of 150° C. and a vapor deposition temperature of about 380° C., and the film thickness and vapor deposition rate calculated from the quartz crystal oscillator was 100 nm and from 0.5 to 1.5 angstrom/s respectively. The field effect transistor had a field-effect mobility of $3.5 \times 10^{-4}$ cm$^2$/V·s and an On/Off ratio of 85. The maximum diameter of crystal grains was 0.6 μm or less.

The present invention is not limited to the above embodiments, and various changes and modifications can be made within the spirit and scope of the present invention. Therefore to apprise the public of the scope of the present invention, the following claims are made.

The invention claimed is:

1. A method of producing a field effect transistor comprising an organic semiconductor layer, comprising a step of heating a coating film comprising a porphyrin compound represented by general formula (1):

general formula (1)

wherein $R_1$ and $R_2$ each independently denote at least one selected from the group consisting of hydrogen, halogen, hydroxyl, and alkyl, oxyalkyl, thioalkyl and alkyl ester, each alkyl having 1 to 12 carbon atoms;

$R_3$ denotes at least one selected from the group consisting of a hydrogen atom and an aryl group; and M denotes two hydrogen atoms, a metal atom or a metal oxide;

to form as the organic semiconductor layer a crystallized film of a porphyrin compound represented by general formula (2):

general formula (2)

wherein $R_2$, $R_3$ and M each denote the same as defined above.

2. The method of producing a field effect transistor according to claim 1, wherein the coating film comprising the porphyrin compound represented by the general formula (1) is heated at a temperature range from 200 to 350° C. to produce the compound of the general formula (2) therefrom.

3. A field effect transistor comprising an organic semiconductor layer composed of a crystallized film of a naphthoporphyrin compound represented by general formula (2):

general formula (2)

wherein $R_1$ and $R_2$ each independently denote at least one selected from the group consisting of hydrogen, halogen, hydroxyl, and alkyl, oxyalkyl, thioalkyl and alkyl ester, each alkyl having 1 to 12 carbon atoms;

$R_3$ denotes at least one selected from the group consisting of a hydrogen atom and an aryl group; and M denotes two hydrogen atoms, a metal atom or a metal oxide, wherein the crystallized film has crystal grains having a maximum diameter of 1 μm or more.

4. The field effect transistor according to claim 3, wherein the organic semiconductor layer comprised of the naphthoporphyrin compound represented by the general formula (2) has a strong absorption at 650 nm or longer.

5. The field effect transistor according to claim 3 or 4, wherein in the naphthoporphyrin compound represented by the general formula (2), $R_2$ is a hydrogen atom.

6. The field effect transistor according to claim 3, wherein in the naphthoporphyrin compound represented by general formula (2), $R_3$ is a hydrogen atom.

7. The field effect transistor according to claim 3, wherein in the naphthoporphyrin compound represented by general formula (2), M represents two hydrogen atoms.

8. The field effect transistor according to claim 3, wherein in the naphthoporphyrin compound represented by general formula (2), M represents one copper atom.

9. The field effect transistor according to claim 3, wherein the organic semiconductor layer has a field effect mobility of $1 \times 10^{-3}$ cm$^2$/V·s or more and an On/Off ratio of 100 or more.

10. A field effect transistor comprising an organic semiconductor layer composed of a crystallized layer of a naphthoporphyrin compound represented by general formula (2):

general formula (2)

wherein $R_1$ and $R_2$ each independently denote at least one selected from the group consisting of hydrogen, halogen, hydroxyl and alkyl, oxyalkyl, thioalkyl and alkyl ester, each alkyl those having 1 to 12 carbon atoms; $R_3$ denotes at least one selected from the group consisting of a hydrogen atom and an aryl group; and M denotes two hydrogen atoms, a metal atom or a metal oxide, wherein the crystallized film has a strong absorption at 650 nm or longer.

* * * * *

UNITED STATES PATENT AND TRADEMARK OFFICE
CERTIFICATE OF CORRECTION

PATENT NO. : 7,094,625 B2
APPLICATION NO. : 10/535202
DATED : August 22, 2006
INVENTOR(S) : Daisuke Miura et al.

It is certified that error appears in the above-identified patent and that said Letters Patent is hereby corrected as shown below:

COLUMN 2:
Line 30, "formed" should read -- has been formed --.

COLUMN 4:
Line 4, "those" should be deleted; and
Line 37, "define" should read -- defined --.

COLUMN 6:
Line 66, "is" should be deleted.

COLUMN 7:
Line 22, "possible." should read -- possible, --;
Line 23, "Because" should read -- because --;
Line 31, "–R–CH=CH–$R_1$." should read -- $R_1$–CH=CH–$R_1$.--;
Line 36, "heating-temperature" should read --heating temperature --; and
Line 49, "not" should read -- is not --.

COLUMN 10:
Line 34, "Synthesis Example 2" should be deleted; and
Line 56 should read -- Sysnthesis Example 2 --.

COLUMN 12:
Line 46, "Comparative Example 1" should be deleted.

COLUMN 13:
Line 1 should read -- Comparative Example 1 ¶ A field --.

UNITED STATES PATENT AND TRADEMARK OFFICE
CERTIFICATE OF CORRECTION

PATENT NO. : 7,094,625 B2
APPLICATION NO. : 10/535202
DATED : August 22, 2006
INVENTOR(S) : Daisuke Miura et al.

It is certified that error appears in the above-identified patent and that said Letters Patent is hereby corrected as shown below:

COLUMN 16:
Line 29, "those" should be deleted.

Signed and Sealed this

Twentieth Day of March, 2007

JON W. DUDAS
*Director of the United States Patent and Trademark Office*